US010424751B2

United States Patent
Doris et al.

(10) Patent No.: US 10,424,751 B2
(45) Date of Patent: Sep. 24, 2019

(54) ORGANIC ELECTROCHEMICAL TRANSISTORS WITH TUNABLE THRESHOLD VOLTAGE

(71) Applicant: Palo Alto Research Center Incorporated, Palo Alto, CA (US)

(72) Inventors: Sean E. Doris, San Francisco, CA (US); Adrien Pierre, South San Francisco, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 38 days.

(21) Appl. No.: 15/801,125

(22) Filed: Nov. 1, 2017

(65) Prior Publication Data

US 2019/0131555 A1    May 2, 2019

(51) Int. Cl.
*G01N 27/414* (2006.01)
*H01L 51/05* (2006.01)
*H01L 51/00* (2006.01)

(52) U.S. Cl.
CPC ...... *H01L 51/0508* (2013.01); *H01L 51/0035* (2013.01); *H01L 51/0037* (2013.01)

(58) Field of Classification Search
CPC .......................... G01N 27/414; H01L 51/0529
See application file for complete search history.

(56) References Cited

U.S. PATENT DOCUMENTS

2009/0042346 A1* 2/2009 Kugler ............... H01L 51/0529
                                                                438/197
2018/0035934 A1* 2/2018 Kiani .................... H01L 27/13

* cited by examiner

*Primary Examiner* — Thomas L Dickey
(74) *Attorney, Agent, or Firm* — Shun Yao; Park, Vaughan, Fleming & Dowler LLP (57) ABSTRACT

One embodiment provides electronic device, which can include at least two organic electrochemical transistors (OECTs). A respective OECT includes a conductive channel, a gate electrically coupled to the conductive channel via a first electrolyte, and source and drain electrodes separated from each other by the conductive channel. The electrochemical potentials of redox-couples of the at least two organic electrochemical transistors are different, thereby resulting in the at least two organic electrochemical transistors having different threshold voltages. An alternative embodiment can provide an organic electrochemical transistor (OECT). The OECT can include a conductive channel, a gate electrically coupled to the conductive channel via a first electrolyte, and source and drain electrodes separated from each other by the conductive channel. The gate can include a conductive current collector and at least one redox-couple. An electrochemical potential associated with the redox-couple varies in response to a stimulus.

19 Claims, 8 Drawing Sheets

FIG. 6 ns with aqueous solutions, bio-compatibility, and high transconductance, they have been explored for applications in chemical sensing, biological sensing and interfacing, neuromorphic computing, logic, and printed electronics. Like any other type of transistor, in order for OECTs to have broad application, the threshold voltage of the OECT needs to be tunable.

ORGANIC ELECTROCHEMICAL TRANSISTORS WITH TUNABLE THRESHOLD VOLTAGE

BACKGROUND

Field

The present disclosure relates to organic electrochemical transistors. More specifically, the present disclosure relates to organic electrochemical transistors with a tunable threshold voltage.

Related Art

The organic electrochemical transistor (OECT) is a transistor in which the drain current is controlled by the injection of ions from an electrolyte into a semiconductor channel, such as a polymer film. The injection of ions in the drain channel can be controlled by the application of a voltage to the gate electrode. Because OECTs have the characteristics of low operating voltage, compatibility with aqueous solutions, bio-compatibility, and high transconductance, they have been explored for applications in chemical sensing, biological sensing and interfacing, neuromorphic computing, logic, and printed electronics. Like any other type of transistor, in order for OECTs to have broad application, the threshold voltage of the OECT needs to be tunable.

SUMMARY

One embodiment provides an electronic device, which can include at least two organic electrochemical transistors (OECTs). A respective OECT includes a conductive channel, a gate electrically coupled to the conductive channel via a first electrolyte, and source and drain electrodes separated from each other by the conductive channel. The electrochemical potentials of redox-couples of the at least two organic electrochemical transistors are different, thereby resulting in the at least two organic electrochemical transistors having different threshold voltages.

In a variation on this embodiment, the conductive channel can include a conductive polymer, a conductive inorganic material, and a small-molecule material. The conductive polymer can include poly(3,4-ethylenedioxythiophene) polystyrene sulfonate (PEDOT:PSS).

In a variation on this embodiment, the redox-couple can include Ferricyanide/Ferrocyanide ($Fe(CN)_6^{3-/4-}$), Iodide/Triiodide ($I^-/I_3^-$), viologen and its derivatives, indigo and its derivatives, Ag/AgCl, Prussian blue, polyaniline, PEDOT, $Cu/Cu^{2+}$, or ferrocene and its derivatives.

In a variation on this embodiment, the redox-couple is dissolved in a second electrolyte.

In a further variation, the OECT can further include a membrane configured to separate the second electrolyte from the first electrolyte, thereby preventing the redox-couple from reacting with the conductive channel.

In a further variation, the membrane can include one or more of: a porous glass frit, an ion-selective membrane, an ion-conductive glass, a polymer membrane, and an ionically conductive membrane.

In a variation on this embodiment, the first electrolyte can include one or more of: water and a salt dissolved in the water, an organic solvent and a salt dissolved in the organic solvent, and an ionic liquid.

In a variation on this embodiment, at least one member of the redox-couple is in solid form.

In a further variation, the solid redox-couple can include an electrochemically active polymer, an insoluble organic redox-couple, an insoluble inorganic redox couple, or an intercalation material.

In a variation on this embodiment, the gate can include at least two redox-couples having different electrochemical potentials.

One embodiment can provide an organic electrochemical transistor (OECT). The OECT can include a conductive channel, a gate electrically coupled to the conductive channel via a first electrolyte, and source and drain electrodes separated from each other by the conductive channel. The gate can include a conductive current collector and at least one redox-couple. An electrochemical potential associated with the redox-couple varies in response to a stimulus.

In a variation on this embodiment, the stimulus can include one of: a temperature change, a change in concentration of a chemical substance, a change in concentration of a biological substance, a change in pH level, a change in humidity, a change in pressure, and a change in heat flow.

BRIEF DESCRIPTION OF THE FIGURES

In the figures, like reference numerals refer to the same figure elements.

DETAILED DESCRIPTION

Overview

Embodiments described herein provide a solution to the technical problems of tuning the threshold voltage of organic electrochemical transistors (OECTs). More specifically, a novel OECT structure with its threshold voltage tunable over a relatively wide range (e.g., hundreds of millivolts) is provided. The novel OECT structure can include a gate electrode that comprises a redox-couple in contact with a current collector. Because the level of channel doping for the novel OECT at zero gate voltage depends on the difference between the electrochemical potentials of the channel polymer redox process and the redox process occurring at the gate, the threshold voltage of the OECT can be set by the electrochemical potential of the gate redox-couple. The gate redox-couple can be dissolved in a supporting electrolyte or present in the solid state as a redox-active polymer or inorganic compound.

OECT with Tunable Threshold Voltage

Figure 1A:
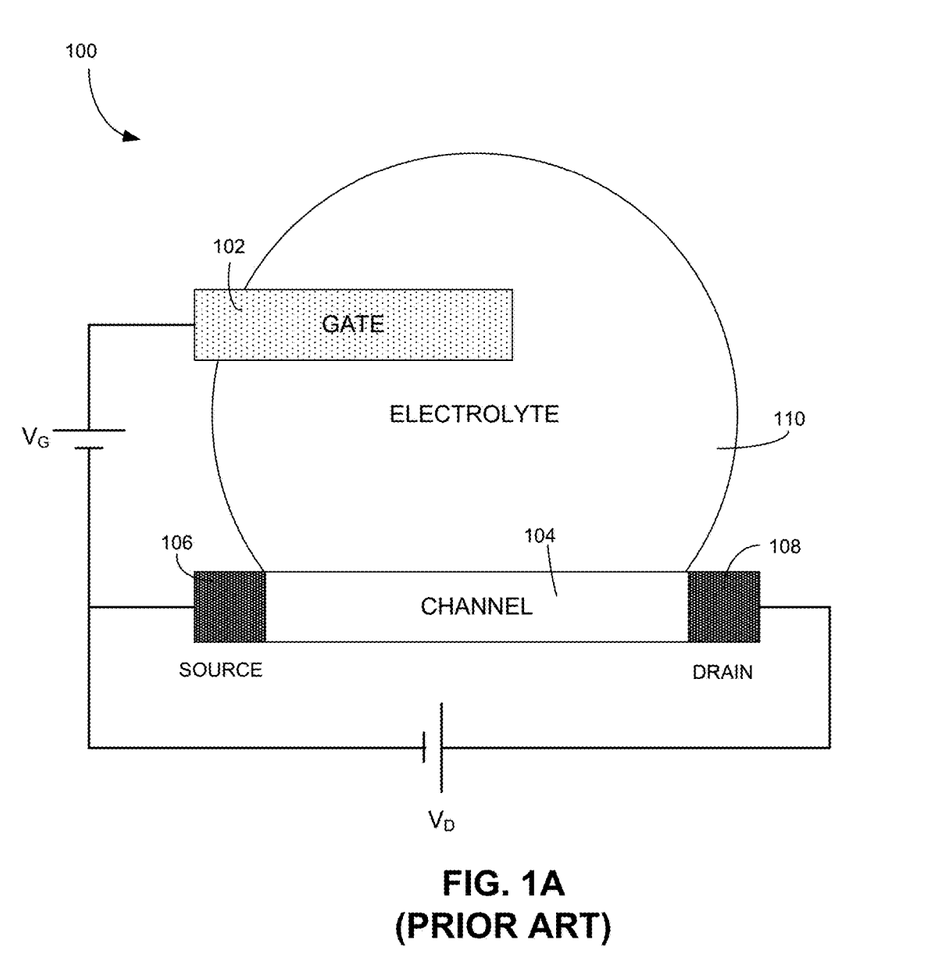
FIG. 1A illustrates a schematic of an organic electrochemical transistor (OECT).

FIG. 1A illustrates a schematic of an organic electrochemical transistor (OECT). OECT 100 can include gate electrode 102, channel 104, which typically can include a semiconductor film (e.g., a conjugate polymer film), source electrode 106, drain electrode 108, and electrolyte 110. Source electrode 106 and drain electrode 108 can establish electrical contact to channel 104, while gate electrode 102 establishes electrical contact to electrolyte 110. Electrolyte 110 can be liquid, gel, or solid. In the most common biasing configuration as shown in FIG. 1A, source electrode 106 is grounded and a voltage (drain voltage $V_D$) is applied to the drain. This can cause a current to flow (drain current), due to electronic charges (usually holes) present in channel 104. When a voltage is applied to the gate (gate voltage $V_G$), ions from the electrolyte are injected in the channel and change the electronic charge density, and hence the drain current. When the gate voltage is removed and the gate is shorted to the source, the injected ions return to the electrolyte and the drain current goes back to its original value.

PEDOT:PSS (poly(3,4-ethylenedioxythiophene) polystyrene sulfonate) is a commonly used channel material due to its commercial availability and high electronic and ionic conductivity. PEDOT:PSS is a polymer mixture of two ionomers. One component in this mixture is made up of sodium polystyrene sulfonate, which is a sulfonated polystyrene (or PSS). Part of the sulfonyl groups are deprotonated and carry a negative charge. The other component, PEDOT, is a conjugated polymer and carries positive charges. Because the organic semiconductor PEDOT is doped p-type by the sulfonate anions of the PSS (the dopant), PEDOT:PSS can exhibit a high (hole) conductivity. Hence, in the absence of a gate voltage, the drain current will be high and the transistor will be in the ON state. When a positive voltage is applied to the gate, ions from the electrolyte (e.g., NaCl in water) are injected into the PEDOT:PSS channel, where they compensate the sulfonate anions. This leads to de-doping of the PEDOT, and the transistor reaches its OFF state.

Figure 1B:
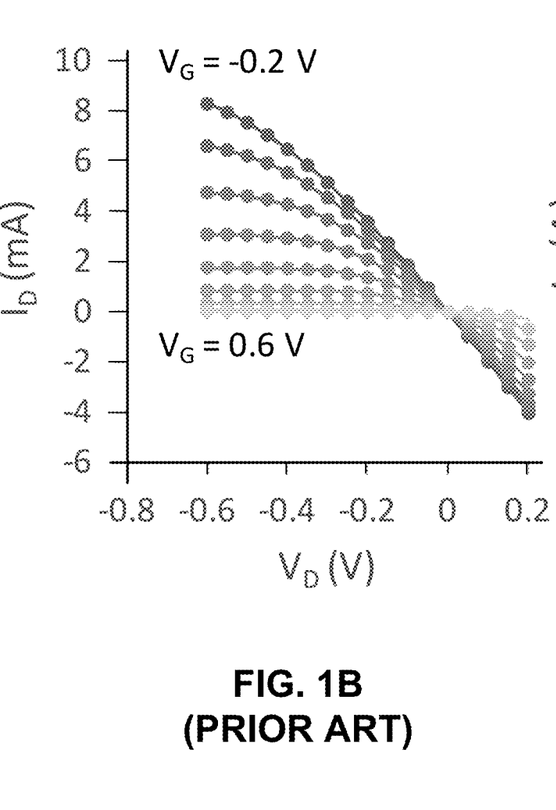
FIG. 1B shows the output function (i.e., drain current vs. drain voltage) at different gate voltages for a typical PEDOT:PSS-based OECT.
Figure 1C:
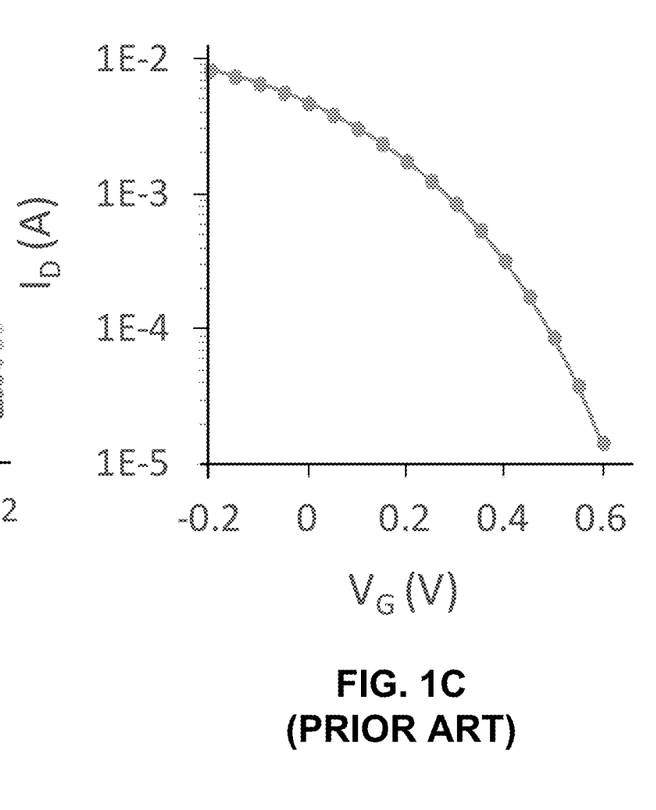
FIG. 1C shows the transfer function (i.e., drain current vs. gate voltage) for the PEDOT:PSS-based OECT.

Using PEDOT:PSS as the channel material has its drawbacks. More specifically, when working with commonly used gate materials (e.g., PEDOT:PSS, Au, Pt, and Ag/AgCl), the channel is neither completely on or off when $V_G=0$. FIG. 1B shows the output function (i.e., drain current vs. drain voltages) at different gate voltages for a typical PEDOT:PSS-based OECT. FIG. 1C shows the transfer function (i.e., drain current vs. gate voltage) for the PEDOT:PSS-based OECT. In this example, the gate can be made of Ag/AgCl, the PEDOT:PSS channel dimension can be 100× 10 μm$^2$, and the electrolyte can include 0.1 M NaCl in water. From FIGS. 1B and 1C, one can see that the OECT is not completely "on" when $V_G=0$, and the threshold voltage can be roughly 0.4 V.

Like other types of transistors (e.g., semiconductor transistors), one may wish to tune the threshold voltage of the OECTs. Current approaches for tuning the OECT's threshold voltage can include developing new conductive polymers with different energy levels for channel material. However, the new conductive polymers derived from PEDOT:PSS often have significantly lower carrier mobility than the highly optimized PEDOT:PSS formulation that is currently used. A more desirable approach is to select a semiconducting material with favorable carrier mobilities and well-understood processing conditions (e.g., the optimized PEDOT:PSS), and then tune the threshold voltage of the transistor by tuning the gate material rather than the channel material. In fact, researchers working with electrolyte-gated field-effect transistors (EGFETs) have successfully tuned the threshold voltage by gating the transistors with metals with different work functions. However, the low capacitance of metallic gates (compared with the capacitance of OECT channels) makes this approach untenable for OECTs.

For OECTs, the channel doping level at zero gate bias is not necessarily the same as the channel's native doping level. Rather, the OECT's channel doping level can depend on the difference between the electrochemical potentials of the channel polymer redox process and the redox process occurring at the gate. In some embodiments, to enable tuning of the OECT threshold voltage, a redox-couple can be used as the part of the gate to set the electrochemical potential of the gate electrode.

Figure 2:
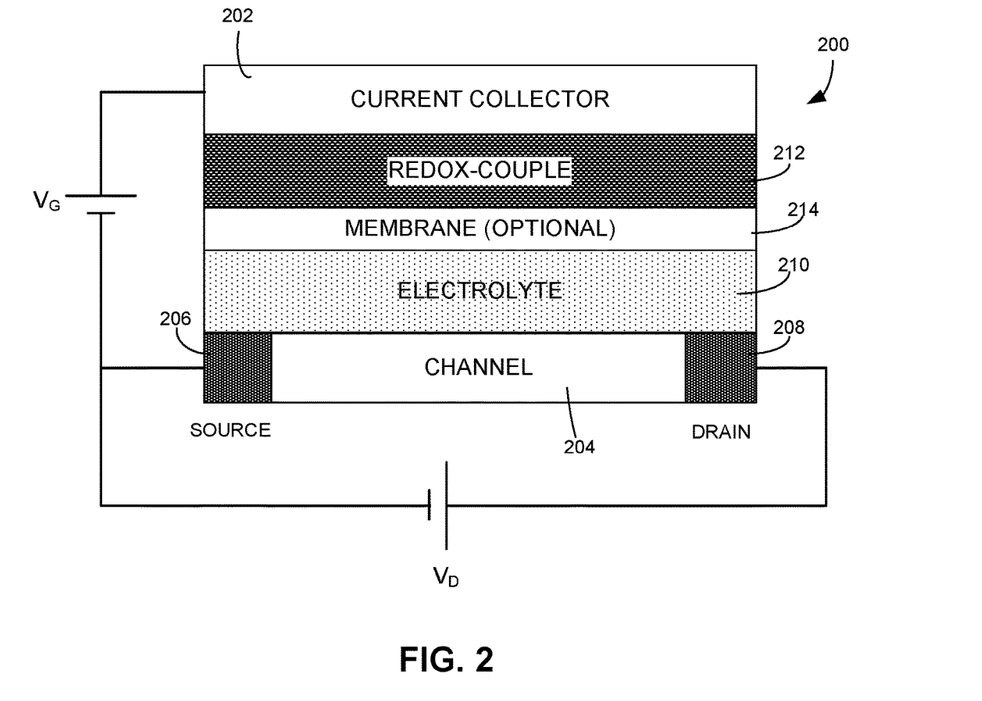
FIG. 2 illustrates a schematic of a novel OECT, according to one embodiment.

FIG. 2 illustrates a schematic of a novel OECT, according to one embodiment. OECT 200 can include a current collector 202, a channel 204, a source electrode 206, a drain electrode 208, an electrolyte layer 210, a redox-couple layer 212, and an optional membrane layer 214. Current collector 202 can be made of highly conductive but inert material, such as Au or Pt. Channel 204 can be made of conductive polymers with high carrier mobility, such as PEDOT:PSS. Source electrode 206 and drain electrode 208 can be similar to the source and drain electrodes, respectively, used in conventional OECTs. Electrolyte layer 210 can include various types of electrolyte solution, such as water with dissolved salt (e.g., NaCl), an organic solvent with dissolved salt, an ionic liquid, etc. Alternatively, electrolyte layer 210 can include electrolyte in gel or solid form.

Redox-couple layer 212 can include one or more redox-couples. A redox-couple can include a reduced species (e.g., $Fe^{2+}$) and its corresponding oxidized form (e.g., $Fe^{3+}$). Examples of redox-couples included in redox-couple layer 212 can include, but are not limited to: Ferricyanide/Ferrocyanide ($Fe(CN)_6^{3-/4-}$), Iodide/Triiodide ($I^-/I_3^-$), viologen and its derivatives, indigo and its derivatives, Ag/AgCl, Prussian blue, polyaniline, PEDOT, $Cu/Cu^{2+}$, ferrocene and its derivatives, etc. In some embodiments, at least two redox-couples can be included in redox-couple layer 212. For example, redox-couple layer 212 can include two redox-couples with very different formal potentials, thus allowing for a sharp change in threshold voltage when charges are injected into the gate. Redox-couple layer 212 can be in liquid form (e.g., redox-couples dissolved in electrolyte) or solid form. When redox-couple layer 212 comprises liquid (i.e., when the redox-couples are dissolved in electrolyte), membrane layer 214 can be used to separate the redox-couples from channel 204, thus preventing the redox-couples from reacting with the channel material. More specifically, the membrane should allow carrier movements between electrolyte layer 210 and redox-couple layer 212, while preventing redox-couple species from entering electrolyte layer 210. Membrane layer 214 can include a porous glass frit, an ion-selective membrane, ion-conductive glass, a polymer membrane, an ionically conductive membrane, etc. When redox-couple layer 212 includes solid-state redox-couples, membrane layer 214 can be optional. Examples of solid-state redox-couples can include, but are not limited to: electrochemically active polymers, insoluble organic and inorganic redox couples, and intercalation materials.

The electrochemical potential of channel 204 can be a function of the doping level of channel 204. As previously discussed, channel 204 can be p-type doped, and the doping level of channel 204 at $V_G=0$ V depends on the difference between the electrochemical potentials of the redox process occurring at channel 204 and the redox process occurred at redox-couple layer 212. For a particular channel material, the doping level of channel 204 can then be adjusted by adjusting the electrochemical potential of redox-couple layer 212. One approach for doing so is to select one or more appropriate redox-couples.

Figure 3A:
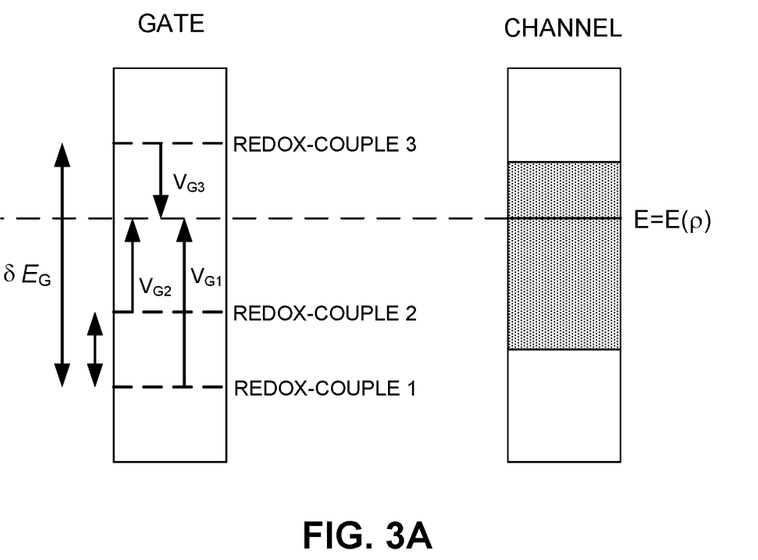
FIG. 3A presents an energy diagram depicting the energy level of the gate with respect to the energy level of the channel when three different redox-couples as used as gate material, according to one embodiment.

FIG. 3A presents an energy diagram depicting the energy level of the gate with respect to the energy level of the channel when three different redox-couples as used as gate material, according to one embodiment. In FIG. 3A, the left side of the drawing shows the electrochemical potential of the gate when three different redox-couples are used as the gate material, with redox-couple 1 providing the lowest potential, while redox-couple 3 provides the highest. The right side of the drawing shows the electrochemical potential of the channel, which can be a function of the channel doping level. The shading indicates the range of potentials reached during the operation of the transistor, including the "on" and "off" stages. At an arbitrary doping level ρ, the electrochemical potential within the channel ($E_C$) can be expressed as $E_C=E_C(\rho)$, where ρ is the doping level, as indicated by the solid line. As discussed previously, the electrochemical potential within the channel is related to the electrochemical potential within the gate ($E_G$) and the gate voltage ($V_G$) according to: $E_C=E_G+V_G$.

FIG. 3A also shows that, in order for the channel to reach the arbitrary doping level, different gate voltages are required for the three different gate materials. More specifically, $V_{G1}$ is required for redox-couple 1, $V_{G2}$ is required for redox-couple 2, and $V_{G3}$ is required for redox-couple 3, respectively. From FIG. 3A, one can also see that, for two different gate materials, the difference in the required gate voltages ($\delta V_G$) to reach the same doping level can depend on the difference in the electrochemical potentials ($\delta E_G$) of the two gate voltages. In other words, $V_{G2}-V_{G1}=E_{G1}-E_{G2}$. For example, using redox-couple Ag/AgAl as a reference, $\delta E_G$ for redox-couple viologen ($Viol^{2+/1+}$) can be −0.6 V, and $\delta E_G$ for redox-couple ferricyanide/ferrocyanide (Fe$(CN)_6^{3-/4-}$) can be 0.21 V.

Figure 3B:
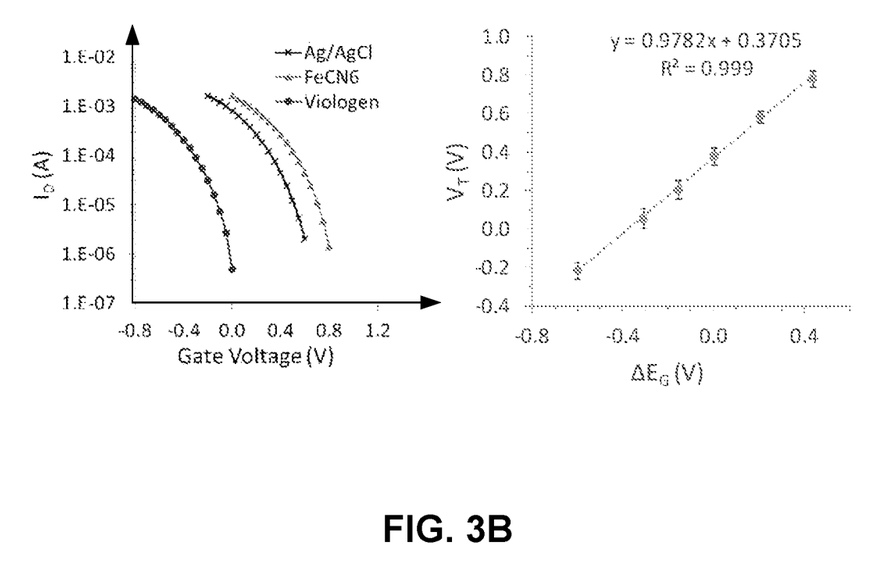
FIG. 3B shows the transfer functions and threshold voltages of three PEDOT:PSS-based OECTs gated with three different types of redox-couple, according to one embodiment.

FIG. 3B shows the transfer functions and threshold voltages of three PEDOT:PSS-based OECTs gated with three different types of redox-couple, according to one embodiment. The left side of the drawing shows the transfer curves for OECTs gated with Ag/AgCl, ferricyanide/ferrocyanide, and viologen. From the drawing, one can see that the transfer curves shifted laterally significantly when different gate materials are used. More specifically, compared to the transfer curve of the OECT gated by Ag/AgCl (the center curve), the transfer curve for the OECT gated by viologen shifts to the left (by roughly 0.6 V), and the transfer curve for the OECT gated by ferrocyanide shifts to the right (by roughly 0.21 V). According to the transfer curves, when the gate is unbiased (i.e., $V_G=0$), the OECT gated by Ag/AgCl is neither completely on nor completely off. However, by selecting a redox-couple with a positive $\delta E_G$ (e.g., ferrocyanide), the OECT can be turned on more at zero gate bias.

Similarly, by selecting a redox-couple with a negative $\delta E_G$ (e.g., viologen), the OECT can be turned off at zero gate bias. The ability to turn off the transistor at zero bias makes it possible to make an accumulation mode OECT transistor based on PEDOT:PSS. The operation of an OECT in accumulation mode allows for low power consumption devices with high ON/OFF ratios. This approach to constructing accumulation mode OECT transistors can retain the ease of processing and high carrier mobility of PEDOT:PSS while allowing for lower circuit power consumption and more flexibility in circuit design.

The right side of FIG. 3B shows the threshold voltages for OECTs gated with different redox-couples as a function of $\delta E_G$, using Ag/AgCl as reference. The slope of the curve is shown to be roughly 1, meaning that the threshold voltage can be tuned on a one on one ratio by tuning $\delta E_G$. For example, by selecting a gate material to obtain a $\delta E_G$ of 0.6 V, one can move the threshold voltage ($V_{th}$) by 0.6 V. Because there is a wide variety of redox-couple to select from, including but not limited to: $Fe(CN)_6^{3-/4-}$, $I^-/I_3^-$, viologen and its derivatives, indigo and its derivatives, Ag/AgCl, Prussian blue, polyaniline, PEDOT, $Cu/Cu^{2+}$, ferrocene and its derivatives, etc., there can be a wide range of shifting of the threshold voltage. Moreover, one can also modulate the composition ratio within a particular redox-couple to fine-tune $\delta E_G$, hence $V_{th}$. For example, using Ag/AgCl as reference, the $\delta E_G$ for redox-couple $Fe(CN)_6^{3-/4-}$ can be roughly 0.2 V if the redox-couple layer includes the same amount of $Fe(CN)_6^{3-}$ and $Fe(CN)_6^{4-}$. Note that $Fe(CN)_6^{3-}$ and $Fe(CN)_6^{4-}$ can coexist in an aqueous solution. On the other hand, if one increases the amount of $Fe(CN)_6^{4-}$ by ten-fold, $\delta E_G$ can be decreased by 60 mV. Similarly, $\delta E_G$ can be increased by 60 mV if the amount of $Fe(CN)_6^{3-}$ is increased by ten-fold. Other ratios between $Fe(CN)_6^{3-}$ and $Fe(CN)_6^{4-}$ can result in different amounts of adjustment of $\delta E_G$. Similar fine-tuning of $\delta E_G$ can be achieved for other types of redox-couple as well. This way, one can fine-tune $V_{th}$ of the PEDOT:PSS OECTs.

OECTs with Dynamically Tunable Threshold Voltage

In addition to tuning the OECT's threshold voltage by selecting different gate materials, in some embodiments, the threshold voltage of an OECT can be tuned dynamically. More specifically, the OECT with a dynamically tunable $V_{th}$ can be gated with a redox-couple with electrochemical potentials that can change under certain conditions. Some redox-couples can have electrochemical potentials that can vary in response to stimuli, such as temperature, heat flow, pressure, humidity, etc. For example, the redox-potential of $Fe(CN)_6^{3-/4-}$ can be strongly temperature-dependent due to the high entropy change upon electron transfers. This is also known as the thermogalvanic effect. Some redox-couples can have electrochemical potentials that vary in response to changing analyte concentration (e.g., pH level, ion, biomolecules, gases, etc.) in the environment. For example, the redox-potential of $Cu/Cu^{2+}$ can be sensitive to the concentration of $Cu^{2+}$ ions in the solution.

Figure 4A:
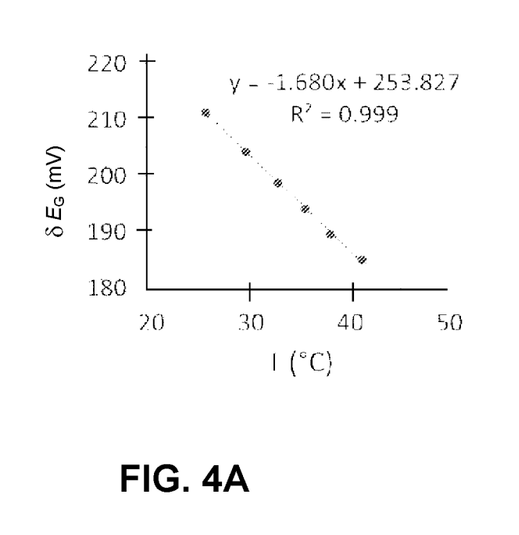
FIG. 4A shows the $\delta E_G$ as a function of temperature for redox-couple $Fe(CN)_6^{3-/4-}$, according to one embodiment.

FIG. 4A shows the $\delta E_G$ as a function of temperature for redox-couple $Fe(CN)_6^{3-/4-}$, according to one embodiment. One can see that $\delta E_G$ can change by about 25 mV when the temperature is increased by roughly 15° C. Other types of temperature-sensitive redox-couples (e.g., molybdenum and tungsten) can also have a similar effect. The thermogalvanic effect allows for the development of temperature sensors. Moreover, OECTs with a temperature-dependent threshold voltage can also be coupled with resistive or thermoelectric heating or cooling elements to serve as simple, printable temperature regulators.

Figure 4B:
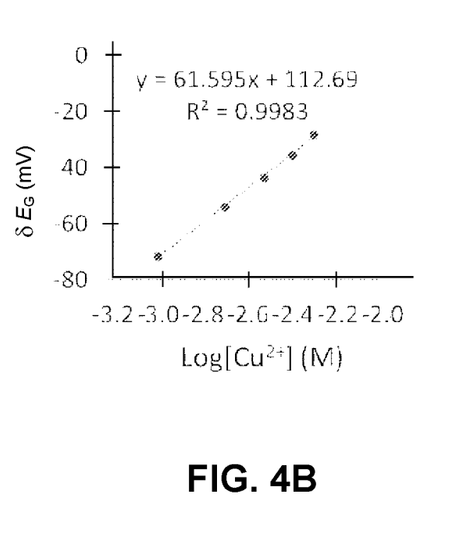
FIG. 4B shows the $\delta E_G$ as a function of $Cu^{2+}$ ion concentration for redox-couple $Cu/Cu^{2+}$, according to one embodiment.

FIG. 4B shows the $\delta E_G$ as a function of $Cu^{2+}$ ion concentration for redox-couple $Cu/Cu^{2+}$, according to one embodiment. One can see that $\delta E_G$ may change significantly when the concentration of the $Cu^{2+}$ ions changes in the solution. An OECT gated with $Cu/Cu^{2+}$ can have a threshold voltage that is sensitive to the concentration of $Cu^{2+}$ ions, thus making such an OECT a good candidate for detecting copper ions (which are a harmful pollutant) in the environment.

Some redox-couples (e.g., polyaniline) may have electrochemical potentials that are sensitive to pH levels. Such redox-couples can be used to produce OECTs with pH-level-dependent threshold voltages, which can then be used for pH-level measurement. Redox-couples that are sensitive to certain bio-molecules can also be used to produce transistors used for biosensing.

In some embodiments, the gate of the OECTs can be constructed in such a way that the gate redox potential varies with time. For example, the gate may include an electrochemical oscillator. This can result in a single-transistor oscillator, which can be used to periodically poll a sensor or perform some other low-power standby task in order to determine whether a more energy-intensive circuit needs to be woken up. Detailed descriptions of the electrochemical oscillator can be found in co-pending U.S. patent application Ser. No. 15/802,215, entitled "ELECTROCHEMICAL CLOCK AND OSCILLATOR DEVICES," filed Nov. 2, 2017, the disclosure of which is incorporated herein by reference in its entirety.

OECT Applications

The ability to tune the threshold voltages of the OECTs has enabled the application of OECTs in areas like printed electronics, wearable devices, the packaging industry, as well as the internet-of-things (IoT). More specifically, OECT transistors with tunable threshold voltages can be used to construct simple logic circuits, which can be useful for allowing low-voltage power sources (e.g., low-cost dye-sensitized solar cells) to power circuits with sensors, memory, and other functionalities. The low-voltage operation enabled by the tunable threshold voltage of the OECTs can also enable new applications like using body heat to provide power for sensors.

Moreover, being able to tune the threshold voltage of the OECTs (e.g., by selecting different gate materials) also greatly simplifies the circuit design for printed electronics. In addition to the previously mentioned single-transistor oscillator, which can be used in polling sensors in a sensor network, other types of low-voltage circuit components can also be achieved using OECTs with tunable voltage. For example, one can construct a logic gate (e.g., an inverter, an AND gate, a NAND gate, etc.) using a number of OECT transistors.

Figure 5A:
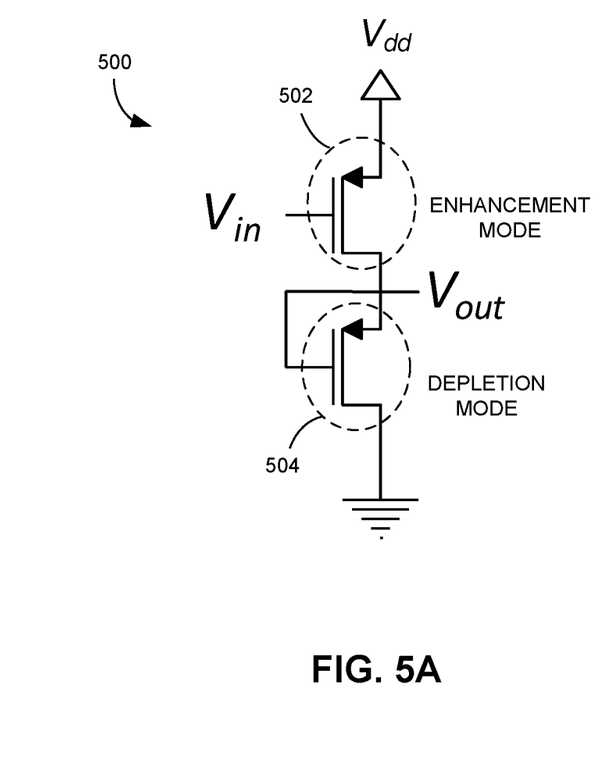
FIG. 5A shows an inverter structure comprising two OECTs, according to one embodiment.
Figure 5B:
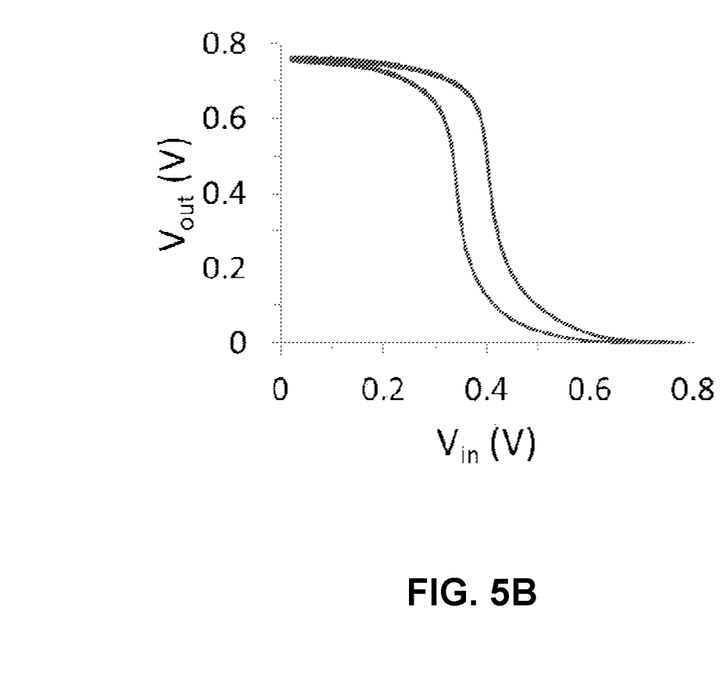
FIG. 5B shows the transfer curve of inverter 500, according to one embodiment.

FIG. 5A shows an inverter structure comprising two OECTs, according to one embodiment. Inverter 500 can include OECTs 502 and 504. OECT 502 can be designed (e.g., by selecting an appropriate gate material) to have a negative threshold voltage (e.g., −0.1 V) such that it operates in enhancement mode, meaning that it is off at zero gate voltage. On the other hand, OECT 504 can be designed to have a positive threshold voltage (e.g., 0.5 V) such that it operates in depletion mode, meaning that it is on at zero gate voltage and can be used as a load resistor. FIG. 5B shows the transfer curve of inverter 500, according to one embodiment.

Figure 5C:
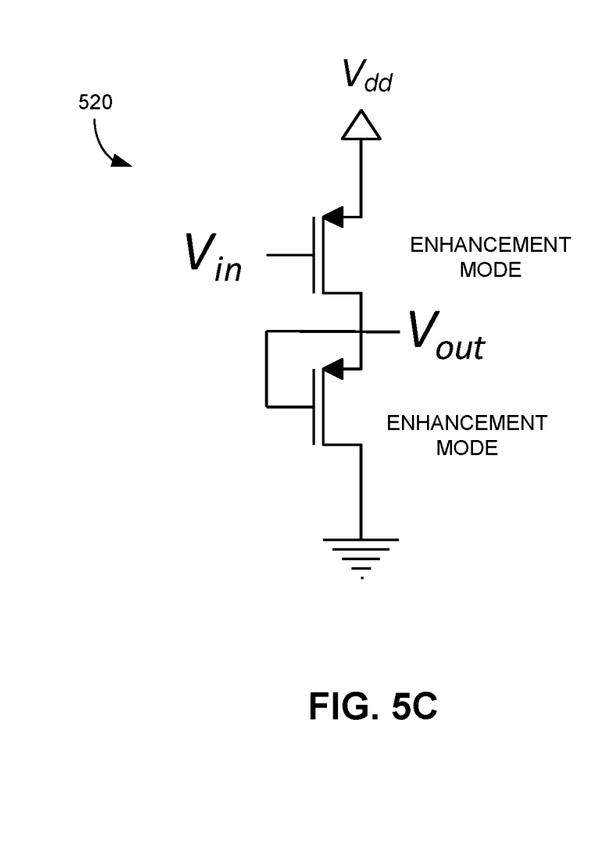
FIG. 5C shows an inverter structure comprising OECTs gated with viologen, according to one embodiment.
Figure 5D:
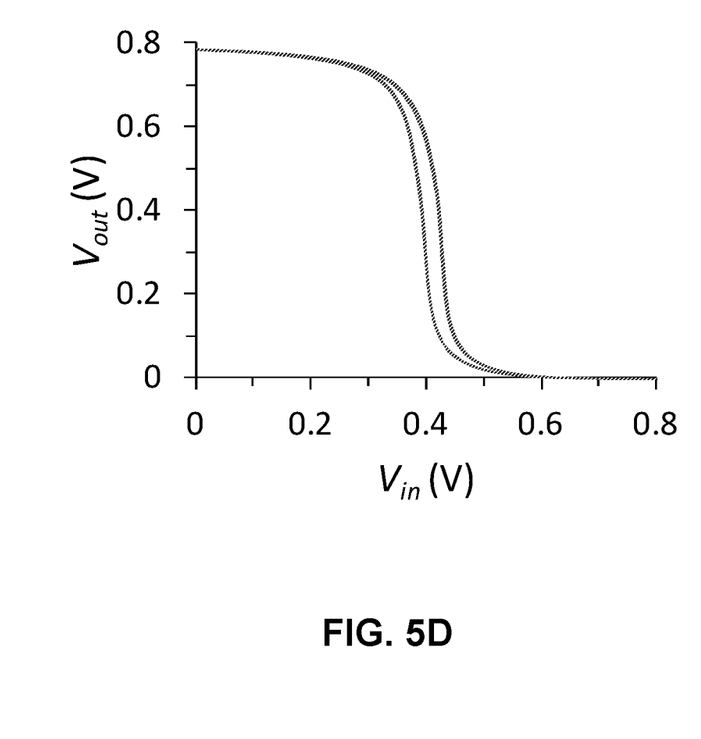
FIG. 5D shows the transfer curve of inverter 520, according to one embodiment.

Different inverter design can also be possible. FIG. 5C shows an inverter structure comprising OECTs gated with viologen, according to one embodiment. In FIG. 5C, both OECTs of inverter 520 have been designed to be gated with viologen and have a threshold voltage at about −0.2 V. As a result, both OECTs are operating in enhancement mode. FIG. 5D shows the transfer curve of inverter 520, according to one embodiment.

Other applications of the novel redox-couple-gated OECTs can include chemical and physical sensing. As discussed previously, by using gates with temperature-dependent electrochemical potentials, one can obtain OECT transistors with temperature-dependent threshold voltages, and such OECT transistors can be used for temperature sensing or constructing temperature regulators. Similarly, by using gates with analyte-dependent electrochemical potentials, one can obtain OECT transistors with analyte-dependent threshold voltages, and such OECT transistors can be used for chemical and biological sensing. In addition to adding more sensing functionalities to OECTs, stimuli-sensitive gates (e.g., temperature-sensitive gates) can also be used to make the OECT channel performance independent of the stimuli. This can be used to reduce the interference effect on certain sensors that are prone to interference. For example, if an OECT-based sensor's channel current is pH-dependent, then a redox-couple with a pH-dependent electrochemical potential can be used to reduce the interference of the pH levels. This is because the pH-dependent change in the channel current can be offset by the change of the redox potential in the redox-couple.

In some embodiments, a diode can be inserted between the gate and the OECT channel to construct OECT-based sensors with memory of their previous minimum or maximum value.

Although most current OECTs are based on p-type polymers (e.g., PEDOT:PSS), new types of material that can be doped with electrons (i.e., n-type doped) have been developed. The n-type semiconductor polymer material can also be gated by redox-couples in a way similar to the one shown in FIG. 2, thus resulting in n-type OECTs with a tunable threshold voltage. Having both n- and p-type OECTs with tunable threshold voltages makes it possible to develop complementary logic circuits, thus potentially dramatically improving the sophistication of bioelectronic devices.

The ability to tune the threshold voltage by careful selection of the gate material allows for optimization of the semiconductor mobility and processability to be decoupled from the energy levels and band structure of the semiconductor polymer material. For example, PEDOT:PSS has many desirable properties, including commercial availability at industrial scales, high carrier mobilities, bio-compatibility, and well-developed processing conditions. However, the threshold voltage of a conventional PEDOT:PSS-based OECT transistor is unsuitable for low-power applications. However, by introducing the redox-couples at the gate, one can retain the desirable properties of PEDOT:PSS while still tuning its threshold voltage to allow for simpler circuit design and new sensing paradigms. The same principle can apply to other types of polymers that may be developed in the future. Particularly, this approach allows the threshold voltage of OECTs to be tuned without changing the properties of the channel, which will be invaluable for integrating OECT materials into sensors and printed electronics applications.

Figure 6:
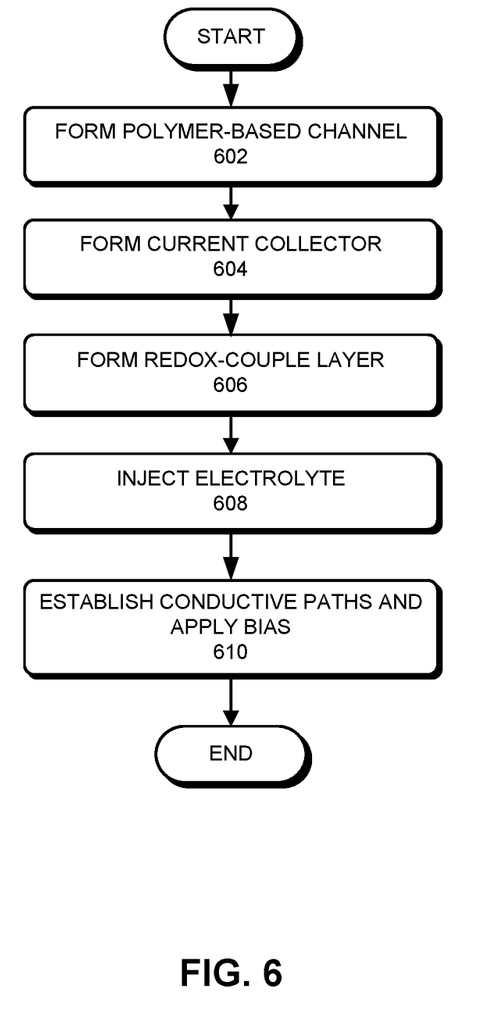
FIG. 6 presents a flowchart illustrating an exemplary process for fabricating an OECT, according to one embodiment.

FIG. 6 presents a flowchart illustrating an exemplary process for fabricating an OECT, according to one embodiment. During operation, a polymer-based channel is formed (operation 602). Depending on the application, the channel may be formed on different types of substrate. For example, for printable electronics, the semiconductor polymer can be directly printed on glass, plastics, or paper. On the other hand, for wearable devices, the semiconductor polymer can be deposited (e.g., using a screen printing technique) onto fabric. The shape of the channel can also be chosen based on the application. The source and drain electrodes can be formed prior to or after the formation of the channel.

In additional to the channel, the current collector may also be formed using a printing technology (operation 604). In some embodiments, the current collector may also include polymer and can be formed simultaneously with the channel. Alternatively, the current collector may include metal and can be formed before or after the channel is formed.

The redox-couple layer can be placed in a way that the redox-couple or redox-couples can be in direct contact with the current collector (operation 606). If the redox-couples are dissolved in a liquid electrolyte, an appropriate confinement mechanism is needed. The confinement mechanism can include a membrane layer separating the redox-couple layer and subsequently deposited or injected electrolyte. Electrolyte can then be deposited between the redox-couples and the channel (operation 608). Similarly, a confinement mechanism can be needed for liquid form electrolyte.

Conductive paths can be established and bias can be applied between the source and drain electrodes of the channel, and between the current collector and the channel (operation 610), thus completing the fabrication of the OECT. The conductive paths can include metal traces printed using various printing technologies, such as ink-jet or screen-printing. The configurations of the conductive paths can be application-specific.

In general, the OECT with tunable threshold voltage can have different sizes and shapes and can be fabricated on different types of substrate material. The different components of the OECT may have a layered structure or may be coplanar. In addition, the materials used to form the different components, including the channel, the current collector, the redox-couple layer, the membrane, and the electrolyte layer do not limit the scope of the invention.

The above description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

What is claimed is:

1. An electronic device, comprising:
at least two organic electrochemical transistors, wherein a respective organic electrochemical transistor comprises:
   a conductive channel;
   a gate electrically coupled to the conductive channel via a first electrolyte, wherein the gate comprises a conductive current collector and at least one redox-couple having a predetermined electrochemical potential; and
   source and drain electrodes separated from each other by the conductive channel;
wherein electrochemical potentials of redox-couples of the at least two organic electrochemical transistors are different, thereby resulting in the at least two organic electrochemical transistors having different threshold voltages.

2. The electronic device of claim 1, wherein the channel comprises one of: a conductive polymer, a conductive inorganic material, and a small-molecule material, and wherein the conductive polymer comprises poly(3,4-ethylenedioxythiophene) polystyrene sulfonate (PEDOT:PSS).

3. The electronic device of claim 1, wherein the at least one redox-couple is selected from a group consisting of:
   $Fe(CN)_6^{3-/4-}$,
   $I^-/I_3^-$,
   viologen and its derivatives,
   indigo and its derivatives,
   Ag/AgCl,
   Prussian blue,
   polyaniline,
   PEDOT,
   $Cu/Cu^{2+}$, and
   ferrocene and its derivatives.

4. The electronic device of claim 1, wherein the at least one redox-couple is dissolved in a second electrolyte.

5. The electronic device of claim 4, further comprising a membrane configured to separate the second electrolyte from the first electrolyte, thereby preventing the at least one redox-couple from reacting with the conductive channel.

6. The electronic device of claim 5, wherein the membrane comprises one or more of:
   a porous glass frit,
   an ion-selective membrane,
   an ion-conductive glass,
   a polymer membrane, and
   an ionically conductive membrane.

7. The electronic device of claim 1, wherein the first electrolyte comprises one or more of:
   water and a salt dissolved in the water,
   an organic solvent and a salt dissolved in the organic solvent, and
   an ionic liquid.

8. The electronic device of claim 1, wherein at least one member of the at least one redox-couple is in solid form.

9. The electronic device of claim 8, wherein the solid redox-couple comprises:
   an electrochemically active polymer,
   an insoluble organic redox-couple,
   an insoluble inorganic redox couple, or
   an intercalation material.

10. The electronic device of claim 1, wherein the gate comprises at least two redox-couples having different electrochemical potentials.

11. An organic electrochemical transistor, comprising:
   a conductive channel;
   a gate electrically coupled to the conductive channel via a first electrolyte, wherein the gate comprises a conductive current collector and at least one redox-couple, wherein an electrochemical potential associated with the at least one redox-couple varies in response to a stimulus, and wherein the at least one redox-couple is dissolved in a second electrolyte; and
   source and drain electrodes separated from each other by the conductive channel.

12. The organic electrochemical transistor of claim 11, wherein the stimulus comprises one of:
   a temperature change,
   a change in concentration of a chemical substance,
   a change in concentration of a biological substance,
   a change in pH level,
   a change in humidity,
   a change in pressure, and
   a change in heat flow.

13. The organic electrochemical transistor of claim 11, wherein the channel comprises one of: a conductive polymer, a conductive inorganic material, and a small-molecule material, and wherein the conductive polymer comprises poly(3,4-ethylenedioxythiophene) polystyrene sulfonate (PEDOT:PSS).

14. The organic electrochemical transistor of claim 11, wherein the at least one redox-couple is selected from a group consisting of:
    $Fe(CN)_6^{3-/4-}$,
    $I^-/I_3^-$,
    viologen and its derivatives,
    indigo and its derivatives,
    Ag/AgCl,
    Prussian blue,
    polyaniline,
    PEDOT,
    $Cu/Cu^{2+}$, and
    ferrocene and its derivatives.

15. The organic electrochemical transistor of claim 11, further comprising a membrane configured to separate the second electrolyte from the first electrolyte, thereby preventing the at least one redox-couple from reacting with the conductive channel.

16. The organic electrochemical transistor of claim 15, wherein the membrane comprises one or more of:
    a porous glass frit,
    an ion-selective membrane,
    an ion-conductive glass,
    a polymer membrane, and
    an ionically conductive membrane.

17. The organic electrochemical transistor of claim 11, wherein the first electrolyte comprises one or more of:
    water and a salt dissolved in the water,
    an organic solvent and a salt dissolved in the organic solvent, and
    an ionic liquid.

18. The organic electrochemical transistor of claim 11, wherein at least one member of the redox-couple is in solid form, and wherein the at least one solid redox-couple comprises:
    an electrochemically active polymer,
    an insoluble organic redox-couple,
    an insoluble inorganic redox couple, or
    an intercalation material.

19. The organic electrochemical transistor of claim 11, wherein the gate comprises at least two redox-couples having different electrochemical potentials.

* * * * *